United States Patent
Brown et al.

(10) Patent No.: US 12,334,320 B2
(45) Date of Patent: Jun. 17, 2025

(54) PVD TOOL TO DEPOSIT HIGHLY REACTIVE MATERIALS

(71) Applicant: INTERNATIONAL BUSINESS MACHINES CORPORATION, Armonk, NY (US)

(72) Inventors: Stephen L. Brown, Yorktown Heights, NY (US); Bruce B. Doris, Slingerlands, NY (US); Mark C. Reuter, Montrose, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 790 days.

(21) Appl. No.: 15/806,454

(22) Filed: Nov. 8, 2017

(65) Prior Publication Data

US 2018/0269045 A1   Sep. 20, 2018

Related U.S. Application Data (63) Continuation of application No. 15/463,159, filed on Mar. 20, 2017, now abandoned.

(51) Int. Cl.
*H01J 37/34* (2006.01)
*C23C 14/24* (2006.01)
(Continued)

(52) U.S. Cl.
CPC .......... *H01J 37/3485* (2013.01); *C23C 14/24* (2013.01); *C23C 14/3414* (2013.01);
(Continued)

(58) Field of Classification Search
CPC ............... H01J 37/3485; H01J 37/3426; H01J 37/3447; H01J 37/3488; H01J 37/34;
(Continued)

(56) References Cited

U.S. PATENT DOCUMENTS 3,492,215 A * 1/1970 Conant .................... C23C 14/22
                                                            204/192.11
3,544,445 A * 12/1970 Moseson ............. H01J 37/3402
                                                            204/192.12
(Continued)

FOREIGN PATENT DOCUMENTS

DE        2110668 A  *  9/1971
JP    2011208265 A  * 10/2011

OTHER PUBLICATIONS

"Seal" definition. Google definition.*
(Continued)

*Primary Examiner* — Michael A Band
(74) *Attorney, Agent, or Firm* — Tutunjian & Bitetto, P.C.; Yuanmin Cai (57) ABSTRACT

A deposition tool includes a vacuum chamber and a physical vapor deposition module including a target source in the vacuum chamber. The target source includes a target material for depositing on a workpiece. An evaporator module is independent of the physical vapor deposition module and is mounted within an enclosure in the vacuum chamber. A gate is configured to selectively open the enclosure to permit evaporation of a coating element to coat the target source in the physical vapor deposition module.

19 Claims, 4 Drawing Sheets

(51) Int. Cl.
*C23C 14/34* (2006.01)
*H01J 37/32* (2006.01)

(52) U.S. Cl.
CPC .......... *H01J 37/32* (2013.01); *H01J 37/3426* (2013.01); *H01J 37/3447* (2013.01)

(58) Field of Classification Search
CPC . C23C 14/3414; C23C 14/58; C23C 14/5806; C23C 14/5813; C23C 14/582; C23C 14/22; C23C 14/3478; C23C 14/3471; C23C 14/34
See application file for complete search history.

(56) References Cited

U.S. PATENT DOCUMENTS

| | | | |
|---|---|---|---|
| 5,800,684 A | 9/1998 | Gagliardi et al. | |
| 5,906,857 A | 5/1999 | McKee et al. | |
| 6,207,029 B1 | 3/2001 | Bergmann | |
| 6,663,755 B2 * | 12/2003 | Gorokhovsky | C23C 14/022 |
| | | | 204/192.38 |
| 7,622,149 B2 | 11/2009 | Xu et al. | |
| 8,030,725 B1 * | 10/2011 | Luu | C23C 14/044 |
| | | | 257/443 |
| 8,133,368 B2 * | 3/2012 | Hawrylchak | C23C 14/3407 |
| | | | 204/298.12 |
| 8,436,257 B2 | 5/2013 | Chang et al. | |
| 8,500,962 B2 | 8/2013 | Guo et al. | |
| 8,500,977 B2 * | 8/2013 | Pei | C23C 14/06 |
| | | | 118/720 |
| 8,968,537 B2 | 3/2015 | Rasheed et al. | |
| 2011/0089030 A1 | 4/2011 | Juliano et al. | |

OTHER PUBLICATIONS

List of IBM Patents or Patent Applications Treated as Related dated Nov. 8, 2017, 2 pages.
US Office Action issued in U.S. Appl. No. 15/463,159, dated Jul. 25, 2019, pp. 1-11.
US Final Office Action issued in U.S. Appl. No. 15/463,159, dated Mar. 26, 2021, pp. 1-15.

* cited by examiner

PVD TOOL TO DEPOSIT HIGHLY REACTIVE MATERIALS

BACKGROUND

Technical Field

The present invention generally relates to semiconductor processing and tools, and more particularly to a physical vapor deposition tool and methods for use that provide protection for highly reactive source materials.

Description of the Related Art

Highly reactive physical vapor deposition (PVD) targets such as, e.g., magnesium oxide (MgO) and lanthanum (La) can absorb water or oxidize very quickly during exposure to air. After initial installation of a new target, there is a significant burn-in time required to clean up water or oxidation on surfaces of the highly reactive target. The clean-up process is needed to prepare the target for deposition of high quality materials. The clean-up process is typically long in duration and can significantly reduce overall tool utilization.

In addition, the highly reactive materials often react with oxygen and water. This can affect the quality of the source material and can have negative impacts when using the source material for deposition of thin films. Further, the source can be burned away more quickly with higher numbers and longer duration burn-in processes.

SUMMARY

In accordance with an embodiment of the present invention, a deposition tool includes a vacuum chamber and a physical vapor deposition module including a target source within the vacuum chamber. The target source includes a target material for depositing on a workpiece. An evaporator module is independent of the physical vapor deposition module and is mounted within an enclosure in the vacuum chamber. A gate is configured to selectively open the enclosure to permit evaporation of a coating element to coat the target source in the physical vapor deposition module.

Another deposition tool includes a vacuum chamber and a physical vapor deposition module including a target source. The target source includes a target material for depositing on a workpiece that is subject to damage when exposed to air. An enclosure is integrally formed within the vacuum chamber, and the enclosure includes a gate configured to selectively open the enclosure. The gate forms an opening opposing a position of the target source in the vacuum chamber. An evaporator module is independent of the physical vapor deposition module and is mounted within the enclosure in the vacuum chamber such that evaporation of a coating element through the gate coats the target source in the physical vapor deposition module.

A method for protecting a target source in a deposition tool includes depositing a thin film on a workpiece using a target source in a physical vapor deposition module; opening a gate to expose an evaporator module to an interior of a vacuum chamber that houses the physical vapor deposition module; and evaporating a coating from the evaporator module onto the target source of the physical vapor deposition module to protect the target source from exposure to reactants.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to eliminating the need for lengthy target clean up processes. In addition, embodiments in accordance with the present invention provide longer life to a target source by reducing the need for long duration burn-in processes. In one embodiment, a physical vapor deposition (PVD) tool includes an evaporator mounted within the tool. The evaporator can be employed to evaporate a protective material onto a highly reactive source or target. The evaporator can be employed to evaporate material that settles on the target to form a coating. The coating or layer can be deposited onto the highly reactive target to protect the target from absorbing water or being oxidized. The target can be coated with protective material, that can include, e.g., Ti, Al, Si, Cr or other useful material. Before the PVD tool is opened to change out a workpiece or change processing, the evaporator applies the protective coating. After the PVD tool is closed, the coating can be removed by sputtering or other process to remove the coating to expose the target material once again for deposition processing.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative to s are tended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
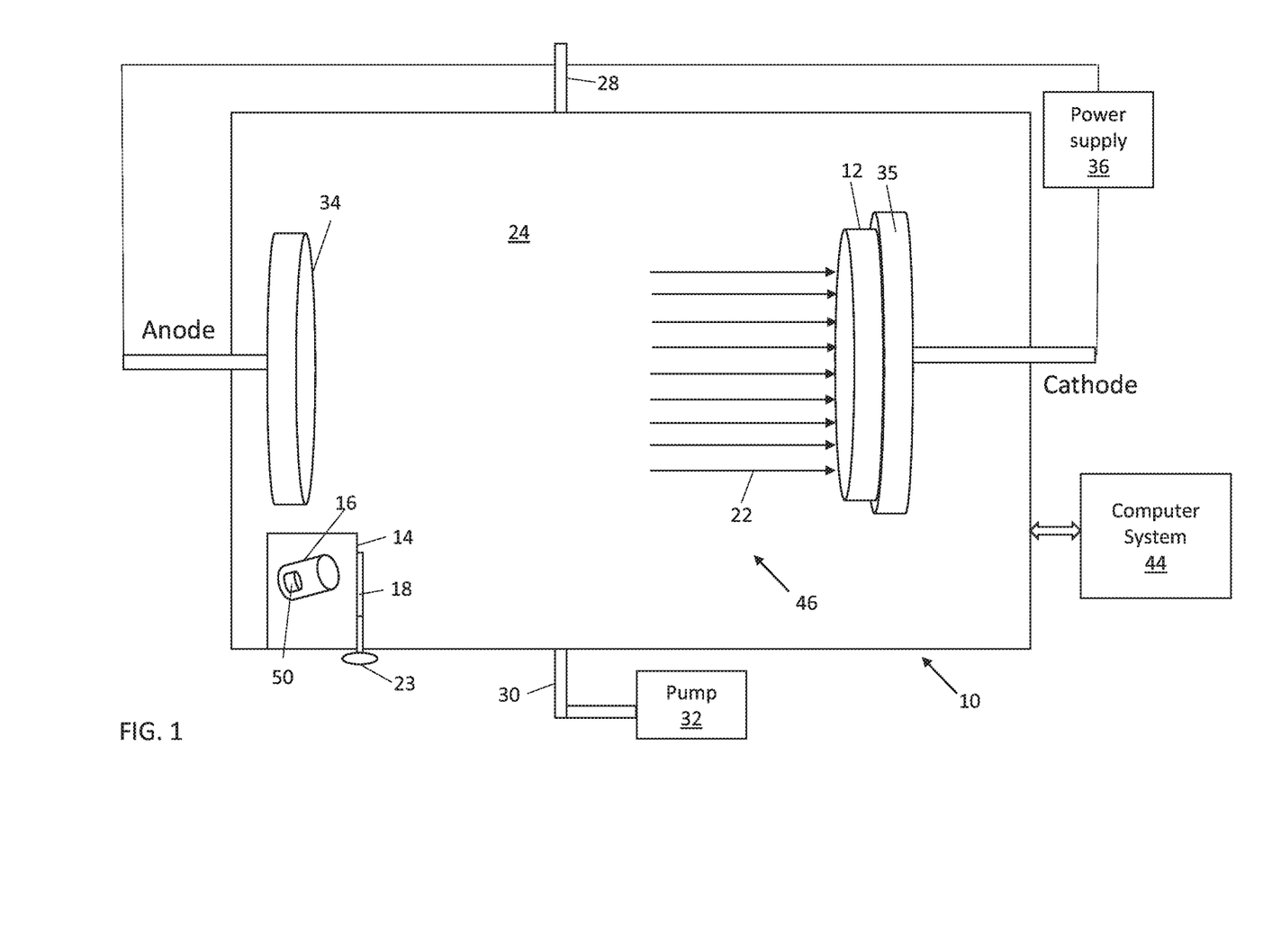
FIG. 1 is a schematic diagram showing a physical vapor deposition (PVD) tool having a PVD module and an evaporation module, the PVD tool for depositing material on a workpiece in accordance with embodiments of the present invention.

Referring now to the drawings in which like numerals represent the same or similar elements and initially to FIG. 1, a physical vapor deposition (PVD) tool 10 is shown in accordance with one illustrative embodiment. The PVD tool can include any PVD tool or combination tool that performs PVD and/or other deposition or etching methods. In one particularly useful embodiment, the PVD tool 10 includes a sputtering function 20. Examples of sputtering functions include Direct Current (DC) diode type systems, radio frequency (RF) sputtering, magnetron sputtering, ionized metal plasma (IMP) sputtering, etc.

The PVD tool 10 can perform a plurality of vacuum deposition processes which can be used to form thin films and coatings. PVD is characterized by a process in which the material goes from a condensed phase to a vapor phase and then back to a thin film condensed phase. The PVD processes can include sputtering and evaporation. PVD can be employed for semiconductor device fabrication, solar panel fabrication, thin films for packaging, tool coatings, etc.

The PVD 10 tool includes a vacuum chamber 24 (which includes a walled pressure vessel) where a source material is provided for PVD processing (e.g., sputtering or evaporation). The PVD tool 10 can include a cathodic arc deposition (e.g., electric arc discharge at a target (source) material that creates a highly ionized vapor to be deposited onto a workpiece (not shown)); evaporative deposition (e.g., material to be deposited is heated to a high vapor pressure by electrical resistance heating in a vacuum); sputter deposition (e.g., glow plasma discharge bombards the material sputtering a vapor for deposition); electron beam PVD (e.g., material to be deposited is heated to a high vapor pressure by electron bombardment in vacuum and transported by diffusion for deposition by condensation on a workpiece 34); pulsed laser deposition (e.g., laser ablates material from the target into a vapor); etc.

The vacuum chamber 24 includes a reduced pressure during operation realized by a tightly sealed system with input gas supply lines 28, output gas lines 30 and a vacuum pump(s) 32. The source material (target) 12 is mounted to face a substrate or workpiece 34 onto which the material grows. In a sputtering system, a gas, e.g., inert argon, is introduced into the chamber 24 and its pressure is set to a processing pressure. The chamber 24 can be cleaned, and/or the highly reactive target 12 target is burned in using the PVD tool 10. A power supply 36 is connected to the target 12, which functions as a cathode 35 (negative potential). A field generated between the cathode 35 and an anode (workpiece 34) accelerates electrons present in the chamber away from the cathode. Before being collected at the grounded chamber walls the electrons collide with gas molecules in the chamber provided by the target 12.

At high electric fields, electron-ion pairs are created through these collisions. This creates an ionized gas or plasma. In addition to ionization, there are other processes occurring, such as excitation, de-excitation, dissociation, etc., which may also influence the growing film. The highly reactive target 12 plasma 22 fills the chamber 24 as an initial step (e.g., burn in). An evaporation module 16 is protected from a PVD module 46 during deposition operations by closing and sealing of an enclosure 14 using a gate 18.

The highly reactive material from the target 12 is deposited on the substrate 34 or a set number of substrates (34) until the set number of substrates have been coated or other processing is completed. Upon completion of the processing, the chamber will be opened or exposed to air (air break) or other process which could potentially expose the source target 12 to degradation due to environmental or ambient conditions.

The PVD tool 10 is well suited for magnetic devices that utilize MgO dielectrics, such as, e.g., magnetic random access memory (MRAM), and magnetic inductors. MRAM includes magnetic storage elements. The elements are formed from two ferromagnetic plates, each of which can hold a magnetization. One of the two plates is a permanent magnet set to a particular polarity; the other plate's magnetization can be changed to match that of an external field to store memory. These plates are separated by a thin insulating layer. The thin insulating layer or other structures can employ highly reactive materials, such as, e.g., MgO or other Mg compound materials.

Figure 2:
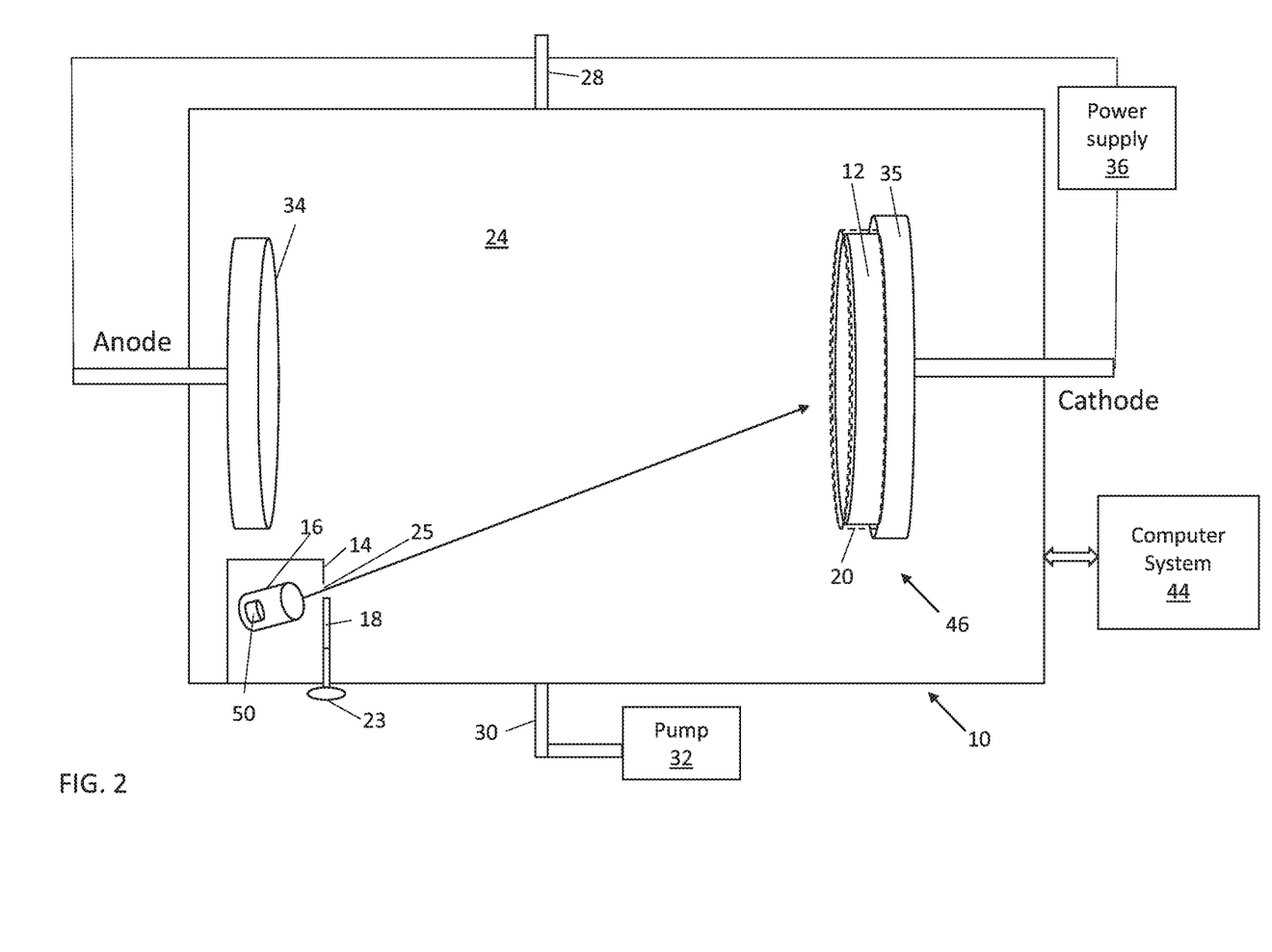
FIG. 2 is a schematic diagram showing the PVD tool having the PVD module and the evaporation module, the evaporation module for coating a target source in accordance with embodiments of the present invention.

Referring to FIG. 2, in accordance with the present embodiments, the PVD tool 10 is provided for depositing material by PVD. The tool 10 provides a coating 20 over the source target 12 to protect the target 12 when the chamber of the tool is opened or during exposure to oxygen, water vapor or other reacting agents. In particularly useful embodiments, the coating 20 can include a metal or metal-containing compound, e.g., Ti, Al, Si, Cr or other useful material.

The coating 20 protects the source material of the target 12 and, in particular, protects highly reactive materials that are employed as the target source 12. The highly reactive materials can include Magnesium Oxide (MgO), Lanthanum (La), Iridium (Ir), Beryllium (Be), Lutetium (Lu), Tellurium (Te), Cerium (Ce), Holmium (Ho), Hafnium (Hf), other reactive metals, metalloids, oxides, compounds, and combinations thereof that can absorb water or oxidize very quickly during exposure to air.

Prior to opening the chamber 24, an evaporation process is performed to provide the protective coating 20 onto the target 12. The coating 20 is applied using an evaporator module 16. The evaporator module 16 is selectively exposed to the vacuum chamber 24 using a valve or gate 18. The evaporator module 16 is mounted within the PVD tool 10 and, more specifically, within a pressure chamber or enclosure 14. The enclosure 14 is opened to permit evaporation products to move into the vacuum chamber 24. An opening 25 preferably faces the target 12, but need not.

During processing, e.g., sputtering, evaporation, etc. of the PVD tool 10, the pressure chamber 14 is closed by closing the gate 18. The gate 18 can include a gate valve, a shutter, a slide panel or other mechanical gate structure. The gate 18 can be manually controlled using handle(s) 23, etc. or automatically controlled using actuators, etc. The controls are preferably provided on the exterior of the chamber 24 to permit manual operation, if needed.

The evaporator module 16 includes an evaporation source 50 that includes a coating material for producing the coating 20 on the target 12. In one embodiment, one or more sources 50 can be employed to form a compound coating (e.g., TiAlN, etc.). The evaporator module 16 can include a heating source/filaments, laser, electron beam, etc. or other energy source for generating evaporated coating materials. The evaporator module 16 is independently operable from a PVD module 46. While some functions may be shared between the PVD module 46 and the evaporator module 16, the two modules can be exclusively operated to perform their respective functions.

In particularly useful embodiments, the PVD tool 10 includes a control or computer system 44, which includes a computer device or system for controlling the operation and timing of operations, monitoring system parameters and acting as an interface with the processing system or tool. In one embodiment, the computer system 44 opens and closes the gate 18 in accordance with a program of instructions or a process or record.

The computer system 44 includes a computer readable storage medium that can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Once the processing (e.g., of the PVD module 46) is complete, the enclosure 14 is opened by opening the gate 18 to expose the evaporator source 50 of the evaporator module 16. The evaporator module 16 is activated to cause the evaporation of a protective coating material. The protective coating material condenses on the target 12 (and other surfaces) within the chamber 24 forming the coating 20 on the target 12.

Now, the chamber 24 can be opened or the target 12 with its coating 20 can be exposed to air or other reactive gases or materials. The coating 20 protects the underlying target material from reacting with oxygen, water vapor or any other reactant gases or materials. While the coating 20 can be applied to protect the target 12 at any time, it is particularly useful to do so before opening the chamber 24 to replace or move the workpiece 34.

The coating 20 can include a conformal coating having a thickness sufficient to prevent chemical reactions with ambient air or other reactants in the chamber 24 or outside the chamber 24. The coating 20 can have a thickness of between about 5 nm to about 20 microns depending on the reactivity of the target material and the threat to the target material. The coating thickness can also depend on the coating material selected and the other processing conditions (e.g., chamber temperature, etc.).

Figure 3:
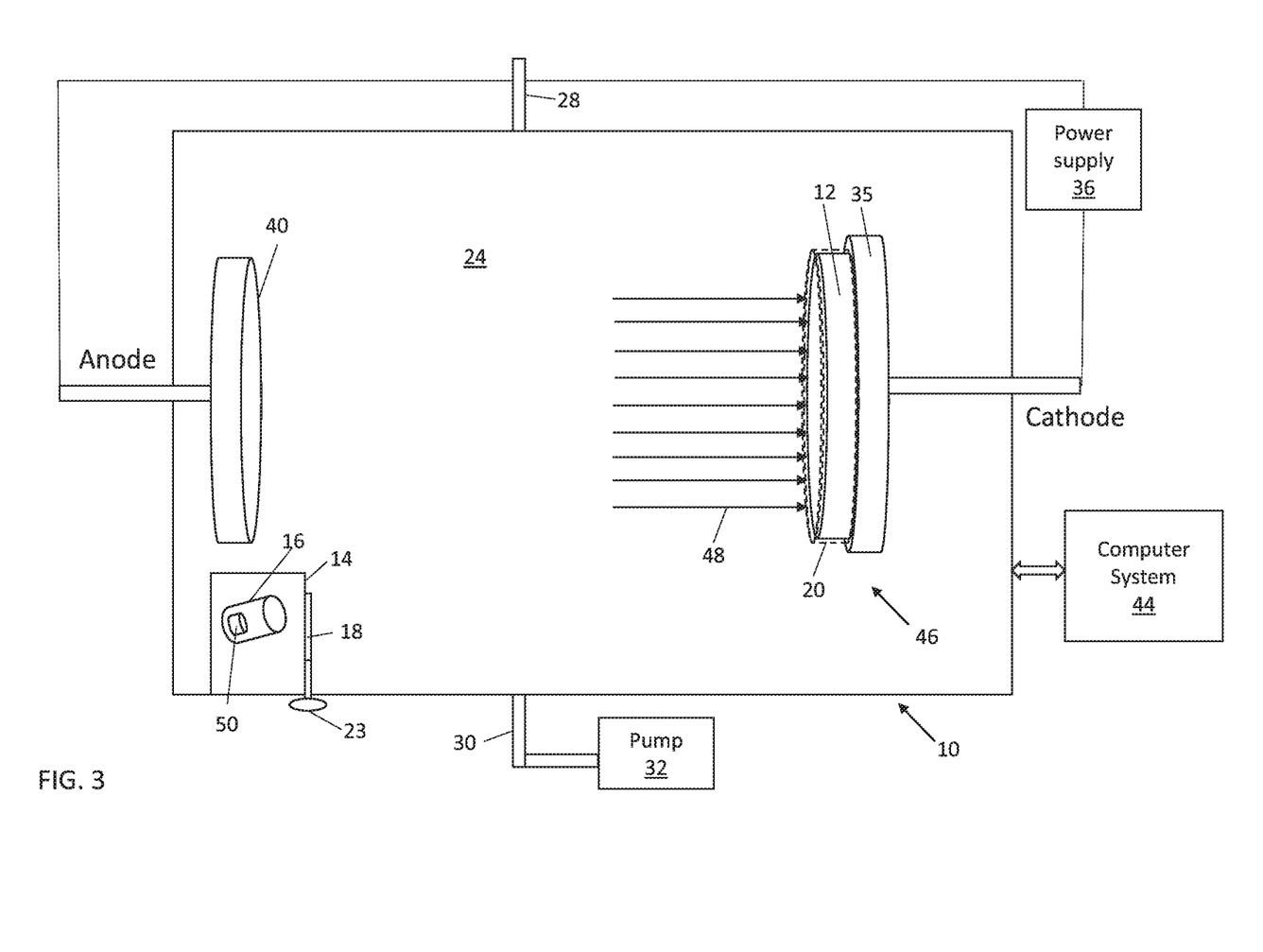
FIG. 3 is a schematic diagram showing the PVD tool having the PVD module and the evaporation module, wherein the coating on the target source is removed by the PVD tool in accordance with embodiments of the present invention.

Referring to FIG. 3, with the workpiece removed, the chamber 24 can be resealed and a new workpiece 40 installed for processing. In this case, the material of the target 12 can be subjected to a sputtering process (e.g., exposed to plasma) to remove the coating 20 and expose the target material 12 once again. Processing can continue with the PVD deposition of a new workpiece 40. Removing the non-reactive coating 20 can employ sputtering or another other removal process that employs reactants 48 (e.g., ions) to remove the coating 20.

It should be understood that the PVD tool 10 is depicted in a basic form for simplicity. The PVD tool 10 can include a plurality of input/output gas lines, power sources, load and unload mechanisms, device holders, valves, meters, gauges, heating devices, cooling devices, etc.

The PVD tool 10 for depositing highly reactive materials includes a PVD module 46 (e.g., cathode target 12 and anode (workpiece 34, 40)) to deposit highly reactive material, and the evaporator module 16 that is separate from the PVD module 46 by the gate valve 18 or other mechanism that can seal off the evaporator module 16. In addition, specific configurations can employ line-of-sight transfer for PVD coatings; however, other complex geometries can be employed for both PVD module 46 and the evaporation module 16.

PVD coatings provide harder and more corrosion resistance than coatings applied by other processes. Most coatings have high temperature and good impact strength, excellent abrasion resistance and are durable. In this way, the coated target 12 can be removed from the chamber 24, transported, stored or otherwise exposed to air or other environmental conditions without losing material of the target 12 to corrosion. Specific technologies can impose constraints; for example, line-of-sight transfer is typical of most PVD coating techniques, however there are methods that can permit full coverage using more complex geometries.

Figure 4:
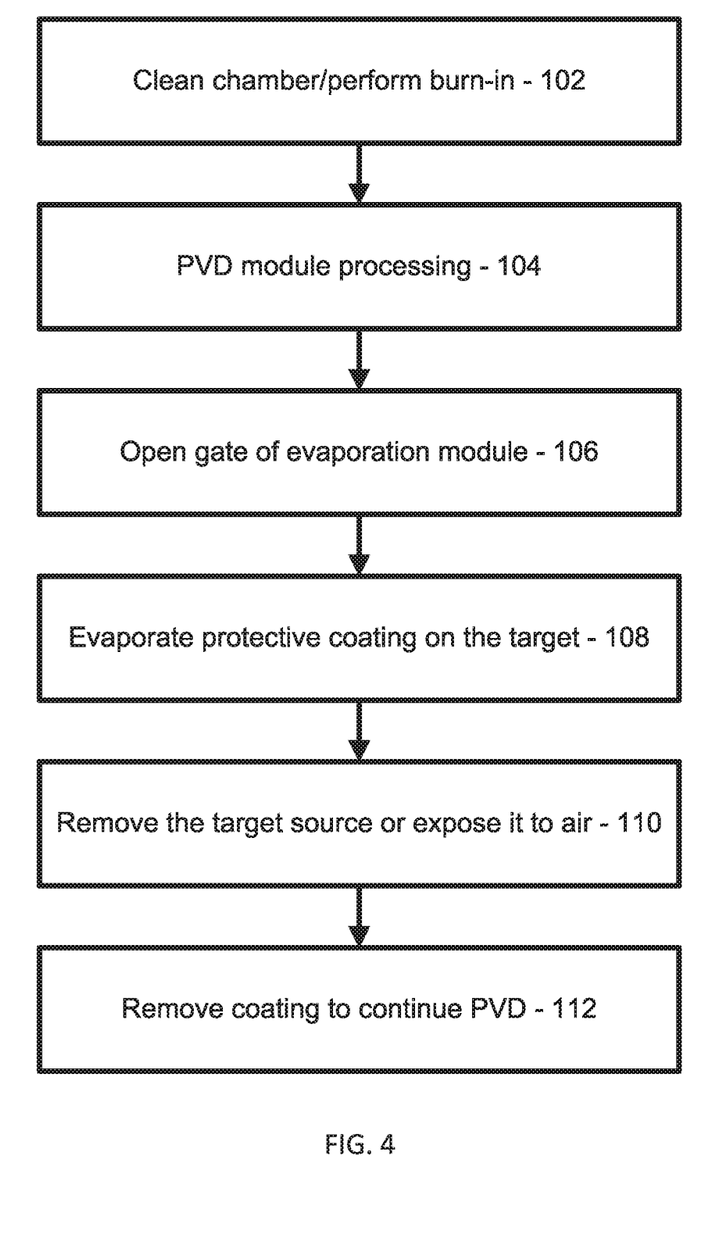
FIG. 4 is a block/flow diagram showing methods for protecting highly reactive material of a target source in accordance with embodiments of the present invention.

Referring to FIG. 4, methods for protecting a target source in a deposition tool are illustratively shown in accordance with embodiments of the present invention. Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a cleaning process can be performed to remove any contaminants or residue from interior positions of the vacuum chamber of a deposition tool. This can include cleaning an evaporation module as well as a PVD module. In one embodiment, a burn-in process can be performed with a gate of an enclosure housing the evaporation module closed, the PVD module can be run to deposit and flow a target material within the chamber. The physical vapor deposition module can include a sputtering tool or any other module suitable for PVD processing.

In block 104, with the evaporation module enclosure closed and the vacuum chamber sealed, a thin film can be deposited on a workpiece or workpieces using a target source in the physical vapor deposition module at its operating conditions. The target source can include, e.g., MgO, La or other highly reactive materials. Any suitable process of the PVD module can be employed that uses material from the target source. Any PVD module process using the target to deposit films on a workpiece, e.g., a semiconductor device, a tool, packaging materials, etc. can be employed.

In block 106, a gate of the evaporation module enclosure is opened to expose an evaporator module to an interior of a vacuum chamber that houses the physical vapor deposition module. This can include opening a gate valve, or other gate mechanism.

In block 108, a coating is evaporated from the evaporator module onto the target source of the physical vapor deposition module to protect the target source from exposure to reactants. The coating can include a material selected from the group consisting of Ti, Al, Si and Cr, although other metals or metal compounds can be employed. The evaporator module is activated with the enclosure (gate) opened to have evaporated materials settle over exposed portions of the target source to coat the target source with a protective barrier to avoid oxidation and reaction with other materials.

The evaporating of the coating is performed independently of depositing the thin film(s) (which is performed by the PVD module). While these processes could be run together, it is preferable to provide the evaporated coating separately from PVD module processing. The PVD module can be employed again for deposition by closing the gate to reseal the enclosure prior to deposition processing with the PVD module.

In block 110, the target source protected by the coating can be removed from the vacuum chamber, exposed to air or other gases in the vacuum chamber, etc. If the target source is well-coated, exposure to air will not degrade the material of the target source. The target source can be transported and even stored (in or out of the chamber) without significant degradation.

In block 112, when ready for deposition again, the coating is removed from the target source by a removal process (e.g., in chamber). The removal process can include a sputtering process although other removal processes are contemplated depending on the PVD module capabilities.

Having described preferred embodiments PVD methods and tools for deposit of highly reactive materials (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for protecting a target source in a deposition tool, comprising:
    depositing a thin film on a workpiece using a target source in a physical vapor deposition module, wherein the physical vapor deposition module includes a vacuum chamber with an electrically grounded chamber sidewall;
    opening a gate of an enclosure automatically using a control mechanism, including an actuator operatively connected to the gate and a computer system in operative communication with the actuator, to expose an evaporator module within the enclosure to an interior of a vacuum chamber that houses the physical vapor deposition module, wherein the control mechanism selectively closes the gate during an entire deposition of the thin film, and wherein the gate and the evaporator module are facing the target source;
    evaporating a coating from the evaporator module onto the target source of the physical vapor deposition module to protect the target source from exposure to reactants subsequent to depositing the thin film on the workpiece; and
    opening the vacuum chamber to remove the workpiece with the deposited thin film, wherein opening the vacuum chamber exposes the target source with the coating to a degrading environment.

2. The method as recited in claim 1, wherein the thin film is a material selected from the group consisting of Magnesium Oxide (MgO), Iridium (Ir), Beryllium (Be), Lutetium (Lu), Tellurium (Te), Cerium (Ce), Holmium (Ho), and Hafnium (Hf).

3. The method as recited in claim 1, further comprising removing an overlayer coating from the target source before forming the thin film, wherein the overlayer coating is removed from the target source by a sputtering process.

4. The method as recited in claim 1, wherein the target source is MgO.

5. The method as recited in claim 4, wherein the coating is a material selected from the group consisting of Si and Cr.

6. The method as recited in claim 1, further comprising removing the target source protected by the coating from the vacuum chamber.

7. The method as recited in claim 1, wherein evaporating the coating is performed independently of depositing the thin film.

8. The method as recited in claim 1, wherein the opening of the gate is performed responsive to a completion of depositing the thin film using the computer system operatively coupled to the control mechanism, wherein the gate includes a gate valve and the control mechanism includes an actuator in operative communication with the computer system.

9. The method as recited in claim 8, wherein evaporating the coating is automatically performed by the computer system responsive to the opening of the gate.

10. A method for protecting a target source in a deposition tool, comprising:
depositing a thin film of material from a target source on a workpiece in a physical vapor deposition module;
opening a gate of an enclosure automatically using a control mechanism, including an actuator operatively connected to the gate and a computer system in operative communication with the actuator, after depositing the thin film to expose an evaporator module within the enclosure to an interior of a vacuum chamber that houses the physical vapor deposition module, wherein the control mechanism selectively closes the gate during the entire deposition of the thin film, and wherein the gate and the evaporator module are facing towards the target source and away from the workpiece; and
evaporating a coating from the evaporator module onto the target source of the physical vapor deposition module to protect the target source from exposure to reactants subsequent to depositing the thin film on the workpiece and after opening the gate.

11. The method as recited in claim 10, wherein the gate is a sealable gate.

12. The method as recited in claim 10, wherein the evaporator module is positioned on an opposite side of the deposition tool from the target source.

13. The method as recited in claim 10, further comprising cleaning the physical vapor deposition module.

14. The method as recited in claim 10, wherein the target source faces the workpiece.

15. The method as recited in claim 10, wherein the eveporator module is positioned closer to the workpiece than to the target source.

16. A method for protecting a target source in a deposition tool, comprising:
depositing a thin film of material from a target source on a workpiece in a physical vapor deposition module, wherein the target source is made of a material selected from the group consisting of Magnesium Oxide (MgO), Iridium (Ir), Beryllium (Be), Lutetium (Lu), Tellurium (Te), Cerium (Ce), Holmium (Ho), and Hafnium (Hf);
opening a gate of an enclosure automatically using a control mechanism, including an actuator operatively connected to the gate and a computer system in operative communication with the actuator, after depositing the thin film within the enclosure to an interior of a vacuum chamber that houses the physical vapor deposition module, wherein the control mechanism selectively closes the gate during deposition of the thin film; and
evaporating a coating from the evaporator module onto the target source of the physical vapor deposition module to protect the target source from exposure to reactants subsequent to depositing the thin film on the workpiece and after opening the gate, wherein the coating is selected from the group consisting of silicon (Si) and chromium (Cr).

17. The method as recited in claim 16, wherein the physical vapor deposition module includes a vacuum chamber with an electrically grounded chamber sidewall.

18. The method as recited in claim 17, wherein the gate is a gate valve.

19. The method as recited in claim 18, wherein the target source is Magnesium Oxide (MgO).

* * * * *